US009048672B2

(12) United States Patent
Shibata (10) Patent No.: US 9,048,672 B2
(45) Date of Patent: Jun. 2, 2015

(54) SEMICONDUCTOR INTEGRATED CIRCUIT, PROTECTION CIRCUIT AND BATTERY PACK

(75) Inventor: Kohei Shibata, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 422 days.

(21) Appl. No.: 13/570,404

(22) Filed: Aug. 9, 2012

(65) Prior Publication Data

US 2013/0057221 A1 Mar. 7, 2013

(30) Foreign Application Priority Data

Sep. 2, 2011 (JP) ................................ 2011-191446

(51) Int. Cl.
*H02J 7/00* (2006.01)
*G01R 19/165* (2006.01)

(52) U.S. Cl.
CPC ......... *H02J 7/0029* (2013.01); *G01R 19/16542* (2013.01); *H02J 2007/004* (2013.01)

(58) Field of Classification Search
CPC ............ H02J 7/0031; H02J 2007/004; H01M 10/441; H01M 10/482; Y02E 60/12
USPC ......................................................... 320/134
See application file for complete search history.

(56) References Cited

U.S. PATENT DOCUMENTS

| 5,177,426 | A  | * | 1/1993  | Nakanishi et al. | 320/134 |
| 5,990,663 | A  | * | 11/1999 | Mukainakano | 320/134 |
| 6,392,387 | B1 | * | 5/2002  | Sage et al. | 320/136 |
| 6,563,292 | B2 | * | 5/2003  | Fujiwara | 320/134 |
| 6,605,925 | B2 | * | 8/2003  | Tange et al. | 320/134 |
| 7,075,306 | B2 | * | 7/2006  | Emori et al. | 324/430 |
| 7,737,664 | B2 | * | 6/2010  | Matsunaga | 320/134 |
| 8,367,234 | B2 | * | 2/2013  | Goto | 429/93 |
| 2001/0052759 | A1 | | 12/2001 | Sakurai et al. | |
| 2010/0129700 | A1 | | 5/2010  | Tanno | |

FOREIGN PATENT DOCUMENTS

| JP | 2002-034163 | | 1/2002 |
| JP | 2002204534 A | * | 7/2002 |
| JP | 2010-124640 | | 6/2010 |

OTHER PUBLICATIONS

Machine translation of the detailed discription of JP2002204534 from web page http://www4.ipdl.inpit.go.jp/Tokujitu/PAJdetail.ipdl?N0000=60&N0120=01&N2001=2&N3001=2002-204534.*

* cited by examiner

*Primary Examiner* — Jack Chiang
*Assistant Examiner* — Brandon Bowers
(74) *Attorney, Agent, or Firm* — IPUSA, PLLC (57) ABSTRACT

A semiconductor integrated circuit that protects a secondary battery by controlling an on/off status of a discharge control switch and a charge control switch includes an over discharge detection part configured to detect an over discharge condition based on a battery voltage of the secondary battery, a load removal detection part to detect whether a load connected to the secondary battery is removed based on a voltage of a load removal detection terminal connected to a negative electrode side of at least one of the load connected to the secondary battery and a battery charger through a resistor, an over discharge return part to return to a normal condition from the over discharge condition, and a control part to output a control signal for returning the over discharge condition to the normal condition to the over discharge return part upon detecting the load being removed in the over discharge condition.

15 Claims, 4 Drawing Sheets

SEMICONDUCTOR INTEGRATED CIRCUIT, PROTECTION CIRCUIT AND BATTERY PACK

CROSS-REFERENCE TO RELATED APPLICATIONS

This patent application is based upon and claims the benefit of priority of Japanese Patent Application No. 2011-191446, filed on Sep. 2, 2011, the entire contents of which are incorporated herein by reference.

BACKGROUND OF THE INVENTION

1. Field of the Invention

The present invention generally relates to a semiconductor integrated circuit, a protection circuit and a battery pack to protect a secondary battery by controlling an on/off status of a discharge control switch and a charge control switch.

2. Description of the Related Art

In recent years, an electronic device and the like driven by utilizing a battery pack that uses a secondary battery are widely used. The secondary battery is charged by allowing the battery pack to be mounted in a battery charger. The secondary battery may be charged by connecting an AC adapter and the like to the electronic device in which the battery pack is mounted.

Control of a charge and a discharge of the secondary battery is performed by a protection circuit that has a function of protecting the secondary battery from an overcharge and an over discharge, and a battery monitoring function of performing management of a remaining battery level and the like.

In such a protection circuit, for example, as a method of returning to a normal condition from a condition of detecting an over discharge (which is hereinafter called an over discharge return), two of a battery charger connecting return and a voltage return are known. The battery charger connecting return is a method of returning to the normal condition from the over discharge condition by detecting a connection of a battery charger to a battery pack. The voltage return is a method of returning to the normal condition from the over discharge by detecting a battery voltage of the secondary battery being charged up to an over discharge return voltage or more.

Figure 1:
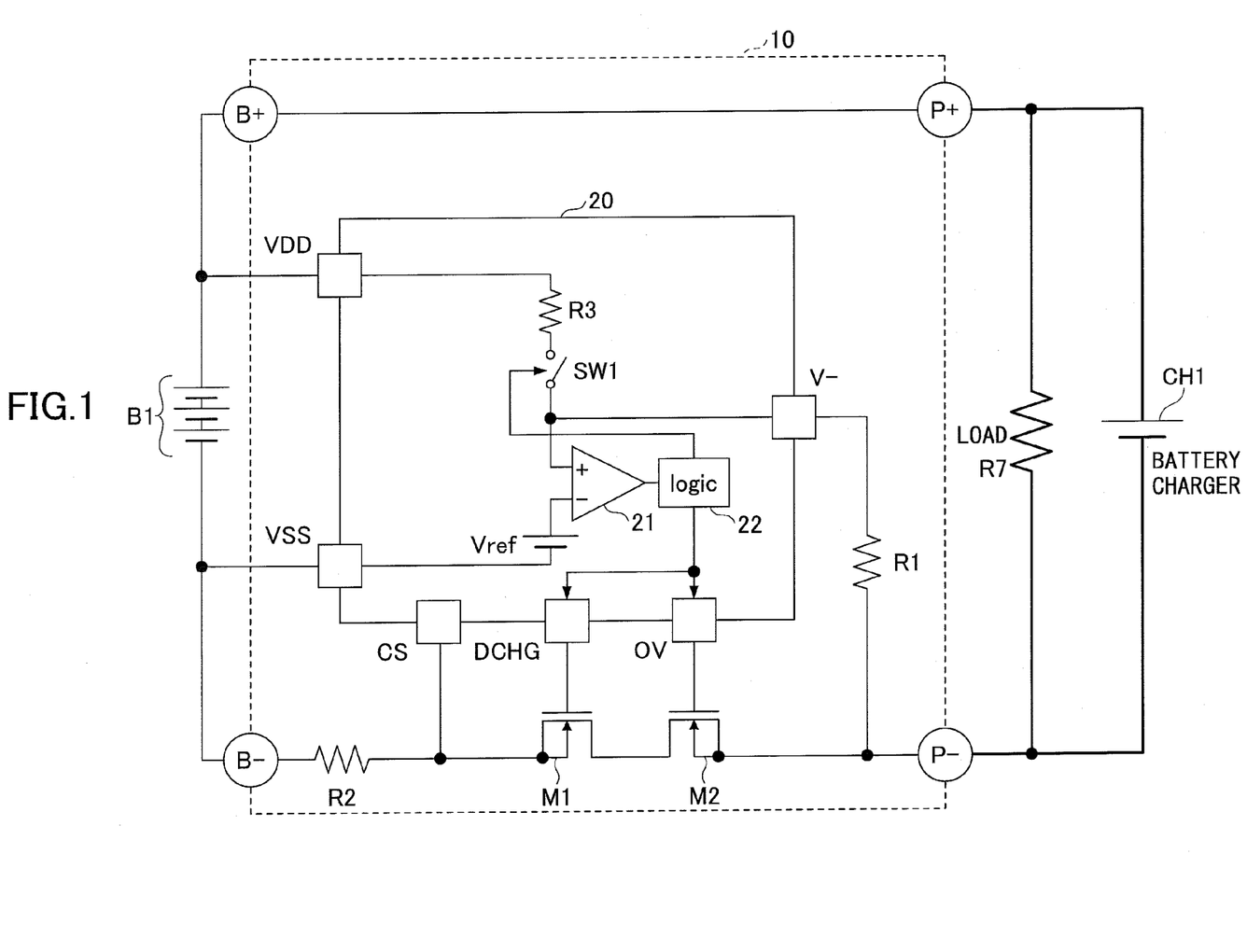
FIG. 1 is a diagram showing an example of a conventional protection circuit that adopts a battery charger connecting return.

FIG. 1 is a diagram showing an example of a conventional protection circuit that adopts the battery charger connecting return. A protection circuit 10 shown in FIG. 1 includes a charge and discharge control IC (Integrated Circuit) 20, a switching transistor M1, a switching transistor M2, a resistor R1, a resistor R2, a B+ terminal, a B− terminal, a P+ terminal, and a P− terminal. Moreover, the charge and discharge control IC 20 includes a comparator 21, a standard voltage Vref, a logic circuit 22, a switch SW1, and a pull-up resistor R3.

A secondary battery B1 is connected between the B+ terminal and the B− terminal, and a battery charger CH1 or a load R7 is connected between the P+ terminal and the P− terminal. When the charge and discharge control IC 20 detects an overcharge from a battery voltage of the secondary battery B1, the logic circuit 22 outputs a control signal to turn the transistor M2 off from a terminal OV and stops charging.

If a load is connected between the P+ terminal and the P− terminal and the battery voltage of the secondary battery B1 becomes equal to or lower than an over discharge detection voltage, the charge and discharge control IC 20 detects an over discharge of the secondary battery B1. When the charge and discharge control IC 20 detects the over discharge, the logic circuit 21 outputs a control signal to turn the transistor M1 off from a terminal DCHG and stops the discharge.

A description is given about the over discharge return in the charge and discharge control IC 20. When the charge and discharge control IC 20 detects an over discharge, the logic circuit 22 turns the switch SW1 on, and an electric potential of a V− terminal is pulled up to a VDD potential by the load R7 and the pull-up resistor R3. If the load R7 connected between the P+ terminal and the P− terminal is removed and a battery charger CH1 is connected between the P+ terminal and the P− terminal, the electric potential of the V− terminal becomes a VSS potential that is not more than the reference voltage Vref. The charge and the discharge control IC 20 detects the electric potential of the V− terminal becoming not more than the reference voltage Vref, and the over discharge condition returns to a normal condition.

For example, Japanese Patent Application Laid-Open Publication No. 2010-124640 discloses a return from an over discharge condition. Also, Japanese Patent Application Laid-Open Publication No. 2002-034163 discloses a return from an over current condition.

In the conventional protection circuit 10, if the load is connected between the P+ terminal and the P− terminal, the battery voltage input into the protection circuit 10 is detected by monitoring a voltage drop caused by a discharge current flowing through the load R7. However, the battery voltage is estimated to be decreased by an amount of additional voltage drop caused by an internal impedance of the secondary battery B1 compared to the actual voltage. If an over discharge detection is performed in this condition, the over discharge detection is detected without using a battery capacity corresponding to the amount of additional voltage drop caused by the impedance of the secondary battery B1. The unavailable battery capacity becomes greater as the discharge current becomes greater.

Moreover, for example, in the conventional protection circuit, if a method of returning to the normal condition from the over discharge condition is the voltage return, and a hysteresis of an over discharge detection voltage and an over discharge return voltage is small, an oscillation that repeats the over discharge detection and the over discharge return may occur. This oscillation tends to occur easily when the discharge current is large. Furthermore, if the hysteresis is made large, a problem similar to the battery charger connecting return may occur.

SUMMARY OF THE INVENTION

Embodiments of the present invention provide a novel and useful semiconductor integrated circuit, protection circuit and battery pack solving one or more of the problems discussed above.

More specifically, embodiments of the present invention provide a semiconductor integrated circuit, a protection circuit and a battery pack that can make full use of a battery capacity efficiently even if a discharge current is large.

According to one embodiment of the present invention, a semiconductor integrated circuit configured to protect a secondary battery by controlling an on/off status of a discharge control switch and a charge control switch includes an over discharge detection part configured to detect an over discharge condition based on a battery voltage of the secondary battery, a load removal detection part configured to detect whether a load connected to the secondary battery is removed or not based on a voltage of a load removal detection terminal connected to a negative electrode side of at least one of the load connected to the secondary battery and a battery charger through a resistor, an over discharge return part configured to return to a normal condition from the over discharge condition, and a control part configured to output a control signal for returning the over discharge condition to the normal condition to the over discharge return part upon detecting the load being removed in the over discharge condition.

According to another embodiment of the present invention, a protection circuit configured to protect a secondary battery includes a positive side terminal and a negative side terminal allowing the secondary battery and at least one of a load and a battery charger to be connected, a discharge control switch, a charge control switch, a semiconductor integrated circuit configured to control an on/off status of the discharge switch and the charge switch. The semiconductor integrated circuit includes an over discharge detection part configured to detect an over discharge condition based on a battery voltage of the secondary battery, a load removal detection part configured to detect whether a load connected to the secondary battery is removed or not based on a voltage of a load removal detection terminal connected to a negative electrode side of at least one of the load connected to the secondary battery and a battery charger through a resistor, an over discharge return part configured to return to a normal condition from the over discharge condition, and a control part configured to output a control signal for returning the over discharge condition to the normal condition to the over discharge return part upon detecting the load being removed in the over discharge condition.

According to another embodiment of the present invention, a battery pack includes a secondary battery, a positive side terminal and a negative side terminal allowing the secondary battery and at least one of a load and a battery charger to be connected, a discharge control switch, a charge control switch, a semiconductor integrated circuit configured to control an on/off status of the discharge switch and the charge switch. The semiconductor integrated circuit includes an over discharge detection part configured to detect an over discharge condition based on a battery voltage of the secondary battery, a load removal detection part configured to detect whether a load connected to the secondary battery is removed or not based on a voltage of a load removal detection terminal connected to a negative electrode side of at least one of the load connected to the secondary battery and a battery charger through a resistor, an over discharge return part configured to return to a normal condition from the over discharge condition, and a control part configured to output a control signal for returning the over discharge condition to the normal condition to the over discharge return part upon detecting the load being removed in the over discharge condition.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to drawings of embodiments of the present invention. A protection circuit of an embodiment adopts a load open return that returns from an over discharge condition when the load is removed.

Figure 2:
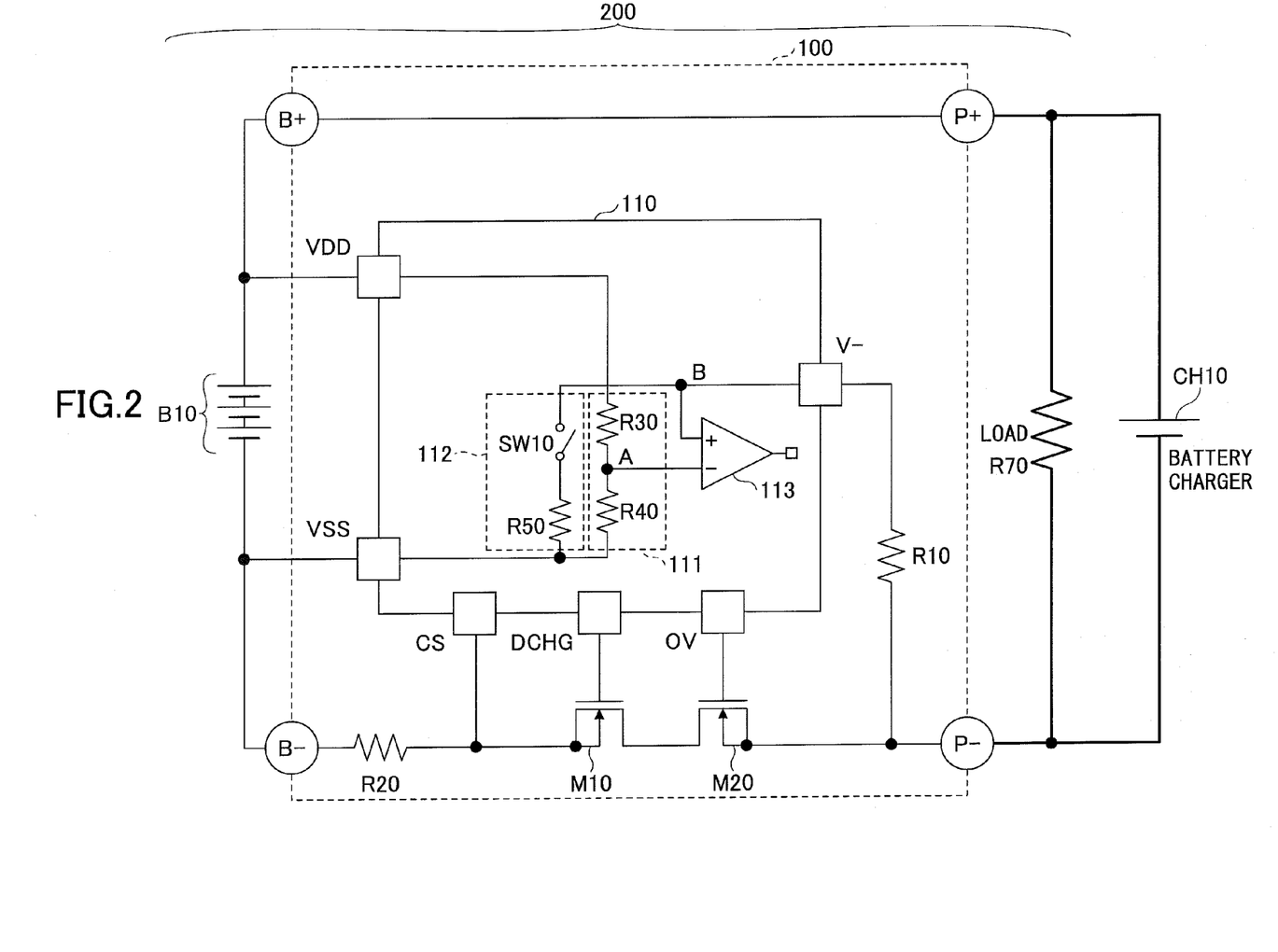
FIG. 2 is a diagram illustrating a protection circuit of an embodiment of the present invention.

FIG. 2 is a diagram illustrating the protection circuit of the embodiment.

The protection circuit 100 includes a charge and discharge control IC 110, a switching transistor M10, a switching transistor M20, a resistor 20, a B+ terminal, a B− terminal, a P+ terminal, and a P− terminal.

The protection circuit 100 constitutes a battery pack 200 by allowing a secondary battery B10 to be connected between the B+ terminal and the B− terminal. A battery charger CH10 and/or a load R70 are connected between the P+ terminal and the P− terminal.

The secondary battery B10 is charged when the battery charger CH10 is connected to the P+ terminal and the P− terminal, and is discharged when the load R70 is connected between the P+ terminal and the P− terminal.

The charge and discharge control IC 110 includes a voltage-dividing circuit 111, an over discharge return circuit 112, a load removal detection comparator 113, a VDD terminal, a VSS terminal, a CS terminal, a DCHG terminal, an OV terminal, and a V− terminal. Here, the charge and discharge control IC 110 includes various circuits to protect the secondary battery B10 other than the above-mentioned configuration. A detailed description about the charge and discharge control IC 110 is given hereinafter.

The VDD terminal is connected to the positive electrode of the secondary battery B10, and the VSS terminal is connected to the negative electrode of the secondary battery B10. The CS terminal is connected to the B− terminal through the resistor R20, and detects a discharge current from the secondary battery B10. The DCHG terminal is connected to the gate of the transistor M10, and the OV terminal is connected to the gate of the transistor M20. The V− terminal is connected to the P− terminal through the resistor R10.

In the charge and discharge control IC 110 of the embodiment, the voltage-dividing circuit 111 is made up of a resistor R30 and a resistor R40 connected in series between the VDD terminal and the VSS terminal, and divides a voltage between the VDD terminal and the VSS terminal. In other words, the voltage-dividing circuit 111 divides a battery voltage of the secondary battery B10 connected between the VDD terminal and the VSS terminal. A voltage of a connecting point A between the resistor R30 and the resistor R40 in the voltage-dividing circuit 111 is supplied to the inverting input terminal of the load removal detection comparator 113. Here, resistance values of the resistor R30 and the resistor R40 may be set so that a voltage of the connecting point A becomes about half of the battery voltage of the secondary battery B10.

The over discharge return circuit 112 is made up of a pull-down resistor R50 and a switch SW10 that are connected between the V− terminal and the VSS terminal in series. A voltage of a connecting point B between an end of the switch SW10 and the V− terminal is supplied to a non-inverting input terminal of the load removal detection comparator 113. An output of the load removal detection comparator 113 is supplied to an over discharge delay circuit 162 described hereinafter.

The charge and discharge control IC 110 outputs a signal to turn on/off the transistor M10 and the transistor M20.

A description is given about operation of the protection circuit 100 of the embodiment in detecting an over discharge hereinafter.

The protection circuit 100 detects an over discharge of the secondary battery B10 when a load R70 is connected between the P+ terminal and the P– terminal and a battery voltage of the secondary battery B10 becomes an over discharge detection voltage or less. If the over discharge is detected, the charge and discharge control IC 110 stops the discharge by outputting a control signal to turn off the transistor M10 from the DCHG terminal. At this time, the switch SW10 is turned on.

When the over discharge is detected and the switch SW10 is turned on, an electric potential of the V– terminal becomes an electric potential that is divided by the load R70, resistor R10, and the pull-down resistor R50. This electric potential becomes higher than the electric potential of the connecting point A because the load R70 is connected to the P+ terminal.

Here, when the load R70 connected between the P+ terminal and the P– terminal of the protection circuit 100 is removed, the electric potential of the V– terminal is reduced to the VSS electric potential by the pull-down resistor R50, and becomes lower than the voltage of the connecting point A to be the over discharge detection voltage. Then, an output of the load removal detection comparator 113 is inverted. That is to say, the V– terminal functions as a load removal detection terminal.

The charge and discharge control IC 110 detects the load being removed by the inversion of the output of the load removal detection comparator 113, and outputs a control signal to turn on the transistor M10 from the DCHG terminal. This causes the protection circuit 100 to return to the normal condition from the over discharge condition. Moreover, the switch SW10 is turned off when the protection circuit 10 returns to the normal condition from the over discharge condition.

Thus, in the embodiment, when the over discharge is detected in the protection circuit 100 by connection of the load R70, and if the load R70 is removed, the protection circuit 100 and the charge and discharge control IC 110 can be returned from the over discharge condition to the normal condition.

Here, the over discharge condition means a condition of a discharge from the secondary battery B10 being stopped, and the normal condition means a condition of the secondary battery B10 capable of being charged and discharged.

Figure 3:
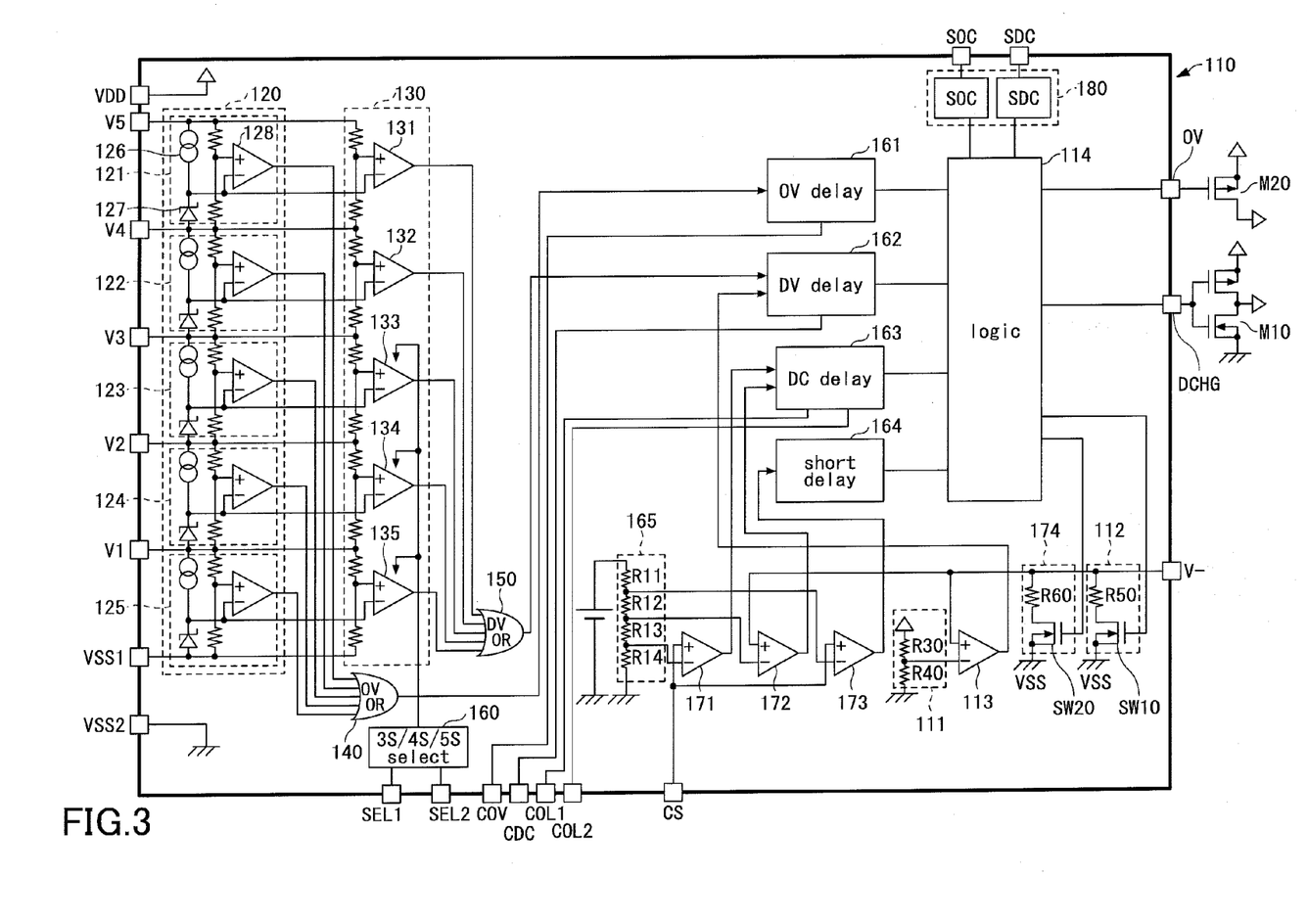
FIG. 3 is a diagram illustrating a charge and discharge IC of the embodiment.

A detailed description is given about the charge and discharge control IC 110 of the embodiment with reference to FIG. 3. FIG. 3 is a diagram illustrating the charge and discharge control IC 110 of the embodiment.

The charge and discharge control IC 110 includes a logic circuit 114, an over charge detection circuit 120, an over discharge detection circuit 130, OR circuits 140 and 150, a selector 160, an over discharge delay circuit 161, an over discharge delay circuit 162, an over current protection circuit 163, a short-circuit detection circuit 164, a reference voltage generation circuit 165, and over current detection comparator 171, an over current release comparator 172, an short-circuit detection comparator 173, an over current return circuit 174, and an external communication control circuit 180.

The over charge detection circuit 120, for example, includes over current detection circuits 121 through 125, considering a case of plural secondary batteries B10 being connected to the protection circuit 100. The over charge detection circuits 121 through 125 detect that voltages of the secondary batteries connected to the respective over charge detection circuits 121 through 125 become a predetermined voltage or more, and output the detection results. Because the over charge detection circuits 121 through 125 respectively have a similar configuration, a description is given only about the over charge detection circuit 121 as an example, and a description about the over discharge detection circuits 122 through 125 is omitted.

The over charge detection circuit 121 is configured to include a V5 terminal, a V4 terminal, a current source 126, a diode 127, and a comparator 128. The current source 126 and the diode 127 are connected between the V5 terminal and the V4 terminal, and generate a predetermined voltage. The comparator 128 compares a voltage divided from the voltage between the V5 terminal and the V4 terminal to a predetermined voltage (i.e., over charge detection voltage), and inverts the output when the divided voltage between the V5 terminal and the V4 terminal becomes the predetermined voltage or more. The voltage between the V5 terminal and the V4 terminal is a battery voltage of a secondary battery connected between the V5 terminal and the V4 terminal.

The outputs of the over charge detection circuits 121 through 125 are supplied to the OR circuit 140, and an output of the OR circuit 140 is supplied to the over charge delay circuit 161. When detecting an overcharge from the output of the OR circuit 140, the over charge delay circuit 161 outputs a signal of the overcharge detection to the logic circuit 114 after passing a predetermined delay time. The logic circuit 114 outputs a signal to turn off the transistor M20 from the OV terminal after receiving the signal of the overcharge detection.

The over discharge detection circuit 130 also includes over discharge detection comparators 131 through 135 similar to the over charge detection circuit 120. Because the over discharge detection comparators 131 through 135 have similar configurations respectively, a description is given only about the over discharge detection comparator 131, and a description about the over discharge detection comparators 132 through 135 is omitted.

The over discharge detection comparator 131 compares a voltage divided from the voltage between the V5 terminal and the V4 terminal to a predetermined voltage (i.e., the over discharge detection voltage), and inverts the output when the divided voltage of the voltage between the V5 terminal and the V4 terminal is the predetermined voltage or less.

The outputs of the over discharge detection comparators 131 through 135 are supplied to the OR circuit 150. An output of the OR circuit 150 is supplied to the over discharge delay circuit 162. When detecting an over discharge from the output of the OR circuit 150, the over discharge delay circuit 162 outputs a signal of the over discharge detection to the logic circuit 114 after passing a predetermined delay time.

The logic circuit 114 outputs a signal to turn off the transistor M10 from the DCHG terminal after receiving the signal of the over discharge detection. Furthermore, the logic circuit 114 turns on the switch SW20 of the over current return circuit 174 upon receiving the signal of the over discharge detection.

The over current return circuit 174 of the present embodiment is a circuit that releases an over current condition and returns to a normal condition when a load R70 is removed. The over current condition means a condition where a discharge current is a predetermined value or more, and the discharge is stopped. In the over discharge return circuit 174, a pull-down resistor R60 and a switch SW20 are connected between the V− terminal and the VSS terminal in series. The switch SW20 may be a transistor.

A voltage of the V− terminal is supplied to the non-inverting input terminal of the over current release comparator 172, and a reference voltage generated by the reference voltage generation circuit 165 is supplied to the inverting input terminal. Here, the reference voltage generation circuit 165 divides a voltage between the VDD terminal and the VSS terminal by any of resistors R11, R12, R13 and R14, and can generate plural reference voltages.

A description is given about operation of cases of an over current being detected and of returning from the over current condition. In the present embodiment, if the over current is detected, the logic circuit 114 turns on the switch SW20. Then, the electric potential of the V− terminal becomes an electric potential divided by the load R70 (not shown in FIG. 3) and the pull-down resistor R60. This electric potential is higher than the reference voltage supplied to the non-inverting input terminal of the over current release comparator 172.

Here, if the load R70 is removed, the electric potential of the V− terminal is lowered to the VSS electric potential by the pull-down resistor R60, and becomes lower than the reference voltage supplied to the over current release comparator 172. Then, an output of the over current release is inverted. The over current protection circuit 163 detects the load R70 being removed by the inverse of the output of the over current release comparator 172, and outputs a control signal to turn on the transistor M10 from the DCHG terminal through the logic circuit 114. This causes the protection circuit 100 to return from the over current condition to a normal condition.

The short detection comparator 173 detects whether an external short circuit occurs between the P+ terminal and the P− terminal based on the CS terminal. If the external short circuit is detected, an output of the short-circuit detection comparator 173 is inverted. The short-circuit detection circuit 164 detects the external short circuit by this inversion of the output, and causes the logic circuit 114 to output a signal to turn off the transistor M20.

The selector 160 outputs a selection signal to select an over current detection comparator that is used in the over discharge detection circuit 130. In the example of FIG. 3, the selection signal from the selector 160 is provided for the over discharge comparators 133, 134 and 135. In this case, secondary batteries are connected between the VSS terminal and the V1 terminal, the V1 terminal and the V2 terminal, and the V2 terminal and the V3 terminal, and the selection signals may be provided so that the over current detection comparators 133, 134 and 135 operate.

Other than the example of FIG. 3, if secondary batteries are connected between the VSS1 terminal and the V1 terminal, the V1 terminal and the V2 terminal, the V2 terminal and the V3 terminal, and the V4 terminal and the V5 terminal respectively, the selector 160 may provide selection signals for the over discharge detection comparators 133, 134 and 135, and may cause the over discharge detection comparators 131 through 135 to operate.

The external communication control circuit 180 includes a SOC terminal and a SDC terminal to communicate with other charge and discharge control ICs if plural charge and discharge control ICs similar to the charge and discharge control IC 110 of the present embodiment are connected to each other.

Figure 4:
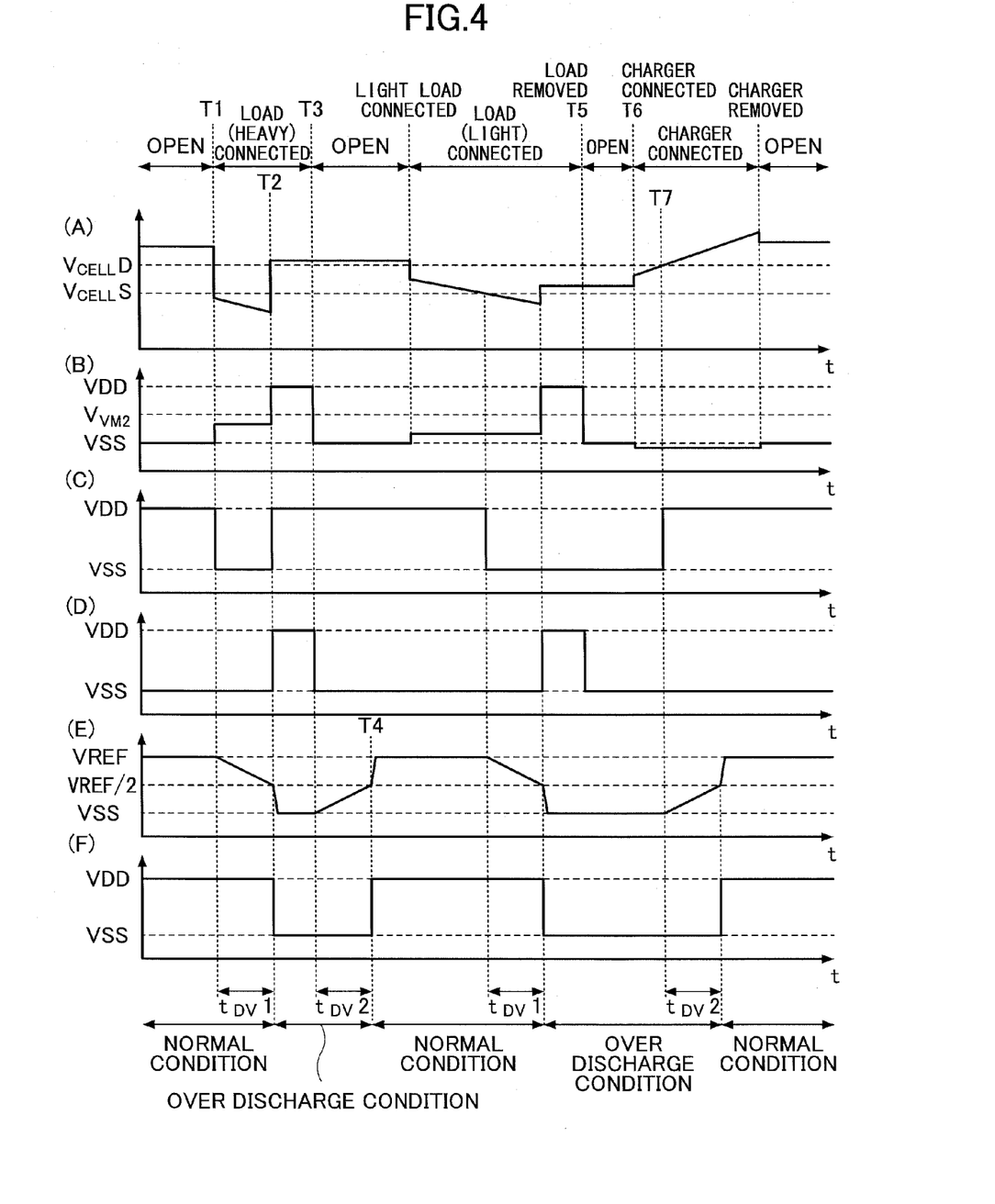
FIG. 4 is a timing chart illustrating operation of an over discharge detection and an over discharge return by a charge and discharge IC of the embodiment.

Here, with reference to FIGS. 3 and 4, a description is given regarding the operation of returning from an over discharge detection to a normal condition. FIG. 4 is a timing chart illustrating the operation of the over discharge detection and the return from the over discharge condition by the charge and discharge control IC 110.

In FIG. 4, a timing chart (A) shows a waveform of a battery voltage, and a timing chart (B) shows a voltage waveform of the V− terminal. A timing chart (C) shows an output waveform of the over discharge detection comparator 131, and a timing chart (D) shows an output waveform of the load removal detection comparator 113. A timing chart (E) shows a voltage waveform of a CDC terminal, and a timing chart (F) shows a voltage waveform of the DCHG terminal.

Here in the following description, a case is described where the over discharge detection comparator 131 detects an over discharge of a secondary battery connected between the V4 terminal and the V5 terminal.

In FIG. 4, if a heavy load is connected between the P+ terminal and the P− terminal of the protection circuit 100 at timing T1, and a battery voltage $V_{CELL}$ of a secondary battery connected between the V4 terminal and the V5 terminal becomes lower than the over discharge detection voltage $V_{CELL}S$ as shown in the timing chart (A), an output of the over discharge detection comparator 131 is inverted from a high level (which is called "H level" hereinafter) to a low level (which is called "L level" hereinafter) as shown in the timing chart (B). An output of the over discharge detection comparator 131 shown in the timing chart (C) is provided for the over discharge delay circuit 162 through the OR circuit 150. The over discharge delay circuit 162 starts to cause a capacitor that is connected to the CDC terminal but is not shown in the drawings to discharge upon receiving the inversed output from the over discharge detection comparator 131, and generates a delay time tDV1. Here, as shown in the timing chart (E), the delay time tDV1 may be a time period until a voltage of the CDC terminal becomes a half of a reference voltage in the over discharge delay circuit 162.

The over discharge delay circuit 162 outputs an over discharge detection signal to the logic circuit 114 at timing T2 when the delay time tDV1 has passed. Upon receiving this signal, the logic circuit 114 changes an output of the DCGH terminal from H level to L level as shown in the timing chart (F), and stops the discharge by turning off the transistor M10. Then, the battery voltage $V_{CELL}$ (see (A)) increases by an amount of voltage drop due to a current that has flowed through the heavy load and an impedance of the secondary battery B10. If the battery voltage $V_{CELL}$ becomes higher than a $V_{CELL}D$ to be an over discharge return voltage, the output of the over discharge detection comparator 131 inverts from L level to H level (see (C)).

Moreover, the logic circuit 114 turns on the switch SW10 of the over discharge return circuit 112 at timing T2. When the switch SW10 is turned on, an electric potential of the V− terminal becomes an electric potential divided by the load and the pull-down resistor R50. This electric potential is higher than an electric potential $V_{VM2}$ of the connecting point A (see (B)). Accordingly, as shown in the timing chart (D), an output of the load removal detection comparator 113 is inverted from L level to H level at timing T2.

Next, if the heavy load is connected between the P+ terminal and the P− terminal of the protection circuit 100 at timing T3, an electric potential of the V− terminal is lowered to the VSS electric potential by the pull-down resistor R50 of the over discharge return circuit 112 (see (B)), and becomes lower than the electric potential $V_{VM2}$ of the connecting point A. Hence, the output of the load removal detection comparator 113 is inverted from H level to L level at timing T3 (see (D)).

The output of the load removal detection comparator 113 is provided for the over discharge delay circuit 162. When the output of the over discharge detection comparator 113 is inverted, the over discharge delay circuit 162 generates a delay time tDV2. Here, the delay time tDV2 is, for example, a time period until a voltage of the CDC terminal causes a capacitor connected to the CDC terminal to be charged, and becomes half of the reference voltage that is not shown in the drawings (see (E)).

When the delay time tDV2 is passed at timing T4, the over discharge delay circuit 162 outputs a signal to report a return to a normal condition to the logic circuit 114. Upon receiving the signal reporting the return to the normal condition, the logic circuit 114 changes the output of the DCGH terminal from L level to H level (see (F)), restarts discharge by turning on the transistor M10, and returns to the normal condition.

Thus, in the embodiment, when the load is removed from the protection circuit 100, if the battery voltage of the secondary battery is the voltage $V_{CELL}D$ or more, the over discharge condition returns to the normal condition without connecting a battery charger between the P+ terminal and the P− terminal.

Next, a description is given about a case of a battery voltage of the secondary battery being the voltage $V_{CELL}D$ or less when the load is removed from the protection circuit 100.

At timing T5 in FIG. 4, even if the load is removed from the protection circuit 100, a battery voltage $V_{CELL}$ of the secondary battery connected between the V4 terminal and the V5 terminal is lower than the voltage $V_{CELL}D$ (see (A)). Due to this, the output of the over discharge detection comparator 131 maintains L level (see (C)).

Here, when a battery charger is connected between the P+ terminal and the P− terminal of the protection circuit 100 at timing T6, and the battery voltage $V_{CELL}$ exceeds the voltage $V_{CELL}D$ at timing T7 (see (A)), the output of the over discharge detection comparator 131 is inverted (see (C)), and the over discharge delay detection circuit 162 generates a delay time tDV2 to return from the over discharge.

In other words, when the load is removed, and if the battery voltage of the secondary battery is the over discharge return voltage or more (see (A)), the over discharge delay circuit 162 starts to generate a delay time by the inversion of the output of the over discharge detection comparator 131 (see (C)). If the battery voltage of the secondary battery is lower than the over discharge return voltage, the over discharge delay detection circuit 162 starts to generate the delay time by the inversion of the output of the over discharge detection comparator 131.

Furthermore, in the charge and discharge control IC 110 of the present embodiment, a resistor value of the pull-down resistor R50 of the over discharge return detection circuit 112 is preferably higher than a resistor value of the pull-down resistor R60 of the over discharge return circuit 174.

In the over discharge return circuit 112, the higher the resistor value of the pull-down resistor R60 becomes, the lower a current flowing between the V− terminal and the VSS terminal in the charge and discharge control IC 110 when the switch SW10 is turned on can become. By reducing the current flowing in the voltage and discharge control IC 110, consumption of the battery voltage from the over discharge detection to the return from the over discharge condition can be reduced. Therefore, according to the embodiment, even if the discharge current is large, a battery capacity can be used up efficiently.

In the embodiment, for example, if a resistor value of the pull-down resistor R50 is made 5 megohm, a resistor value of the pull-down resistor R60 may be made tens of kilo-ohm.

In this way, according to embodiments of the present invention, it is possible to efficiently use up a battery capacity even if a discharge current is large.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor integrated circuit configured to protect a secondary battery by controlling an on/off status of a discharge control switch and a charge control switch comprising:
    an over discharge detection part configured to detect an over discharge condition based on a battery voltage of the secondary battery;
    a load removal detection part configured to detect whether a load connected to the secondary battery is removed or not based on a voltage of a load removal detection terminal connected to a negative electrode side of at least one of the load connected to the secondary battery and a battery charger through a resistor;
    an over discharge return part configured to return to a normal condition from the over discharge condition; and
    a control part configured to output a control signal for returning the over discharge condition to the normal condition to the over discharge return part upon detecting the load being removed in the over discharge condition.

2. The semiconductor integrated circuit as claimed in claim 1, further comprising:
    a voltage-dividing circuit configured to divide the battery voltage of the secondary battery,
    wherein the load removal detection part is a comparator configured to compare a voltage of the load removal detection terminal to the divided battery voltage divided by the voltage-dividing circuit.

3. The semiconductor integrated circuit as claimed in claim 2, further comprising:
    a first terminal connected to a positive electrode of the secondary battery; and
    a second terminal connected to a negative electrode of the secondary battery,
    wherein the over discharge return part is connected between the load removal detection terminal and the second terminal.

4. The semiconductor integrated circuit as claimed in claim 3,
    wherein the over discharge return part includes a switch and a pull-down resistor,
    wherein one end of the switch is connected to the load removal detection terminal, and the other end of the switch is connected to one end of the pull-down resistor, and
    wherein the other end of the pull-down resistor is connected to the second terminal.

5. The semiconductor integrated circuit as claimed in claim 4,
    wherein the control part
    causes the switch of the over discharge return part to be turned on in entering the over discharge condition after a predetermined delay time has passed since the over discharge detection part detected the over discharge condition, and causes the switch to be turned off in returning from the over discharge condition to the normal condition after a predetermined time period has passed since the load removal detection part detected the load being removed.

6. A protection circuit configured to protect a secondary battery comprising:
a positive side terminal and a negative side terminal allowing the secondary battery and at least one of a load and a battery charger to be connected;
a discharge control switch;
a charge control switch;
a semiconductor integrated circuit configured to control an on/off status of the discharge switch and the charge switch,
wherein the semiconductor integrated circuit includes an over discharge detection part configured to detect an over discharge condition based on a battery voltage of the secondary battery;
a load removal detection part configured to detect whether a load connected to the secondary battery is removed or not based on a voltage of a load removal detection terminal connected to a negative electrode side of at least one of the load connected to the secondary battery and a battery charger through a resistor;
an over discharge return part configured to return to a normal condition from the over discharge condition; and
a control part configured to output a control signal for returning the over discharge condition to the normal condition to the over discharge return part upon detecting the load being removed in the over discharge condition.

7. The protection circuit as claimed in claim 6, further comprising:
a voltage-dividing circuit configured to divide the battery voltage of the secondary battery,
wherein the load removal detection part is a comparator configured to compare a voltage of the load removal detection terminal to the divided battery voltage divided by the voltage-dividing circuit.

8. The protection circuit as claimed in claim 7, further comprising:
a first terminal connected to a positive electrode of the secondary battery; and
a second terminal connected to a negative electrode of the secondary battery,
wherein the over discharge return part is connected between the load removal detection terminal and the second terminal.

9. The protection circuit as claimed in claim 8,
wherein the over discharge return part includes a switch and a pull-down resistor,
wherein one end of the switch is connected to the load removal detection terminal, and the other end of the switch is connected to one end of the pull-down resistor, and
wherein the other end of the pull-down resistor is connected to the second terminal.

10. The protection circuit as claimed in claim 9,
wherein the control part
causes the switch of the over discharge return part to be turned on in entering the over discharge condition after a predetermined delay time has passed since the over discharge detection part detected the over discharge condition, and causes the switch to be turned off in returning from the over discharge condition to the normal condition after a predetermined time period has passed since the load removal detection part detected the load being removed.

11. A battery pack comprising:
a secondary battery;
a positive side terminal and a negative side terminal allowing the secondary battery and at least one of a load and a battery charger to be connected;
a discharge control switch;
a charge control switch;
a semiconductor integrated circuit configured to control an on/off status of the discharge switch and the charge switch,
wherein the semiconductor integrated circuit includes an over discharge detection part configured to detect an over discharge condition based on a battery voltage of the secondary battery;
a load removal detection part configured to detect whether a load connected to the secondary battery is removed or not based on a voltage of a load removal detection terminal connected to a negative electrode side of at least one of the load connected to the secondary battery and a battery charger through a resistor;
an over discharge return part configured to return to a normal condition from the over discharge condition; and
a control part configured to output a control signal for returning the over discharge condition to the normal condition to the over discharge return part upon detecting the load being removed in the over discharge condition.

12. The battery pack as claimed in claim 11, further comprising:
a voltage-dividing circuit configured to divide the battery voltage of the secondary battery,
wherein the load removal detection part is a comparator configured to compare a voltage of the load removal detection terminal to the divided battery voltage divided by the voltage-dividing circuit.

13. The battery pack as claimed in claim 12, further comprising:
a first terminal connected to a positive electrode of the secondary battery; and
a second terminal connected to a negative electrode of the secondary battery,
wherein the over discharge return part is connected between the load removal detection terminal and the second terminal.

14. The battery pack as claimed in claim 13,
wherein the over discharge return part includes a switch and a pull-down resistor,
wherein one end of the switch is connected to the load removal detection terminal, and the other end of the switch is connected to one end of the pull-down resistor, and
wherein the other end of the pull-down resistor is connected to the second terminal.

15. The battery pack as claimed in claim 14,
wherein the control part
causes the switch of the over discharge return part to be turned on in entering the over discharge condition after a predetermined delay time has passed since the over discharge detection part detected the over discharge condition, and
causes the switch to be turned off in returning from the over discharge condition to the normal condition after a predetermined time period has passed since the load removal detection part detected the load being removed.

* * * * *